(12) United States Patent
Terashima

(10) Patent No.: US 6,518,512 B2
(45) Date of Patent: Feb. 11, 2003

(54) STRUCTURE FOR INSPECTING ELECTRICAL COMPONENT ALIGNMENT

(75) Inventor: Kiminori Terashima, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/017,431

(22) Filed: Dec. 14, 2001

(65) Prior Publication Data

US 2002/0079132 A1 Jun. 27, 2002

(30) Foreign Application Priority Data

Dec. 27, 2000 (JP) ........................................ 2000-401364

(51) Int. Cl.7 ................................................ H05K 1/16
(52) U.S. Cl. ..................... 174/260; 29/832; 257/786; 356/401; 348/87; 361/777; 382/151
(58) Field of Search .................. 29/834, 832; 356/401; 174/260; 301/760, 777; 257/778, 786; 382/147, 151; 348/87; 438/975

(56) References Cited

U.S. PATENT DOCUMENTS

| | | | |
|---|---|---|---|
| 4,776,088 A | * | 10/1988 | Biggs et al. ................ 29/834 |
| 5,627,913 A | * | 5/1997 | Spigarelli et al. ........... 382/151 |
| 5,643,835 A | * | 7/1997 | Chia et al. ................... 29/834 |
| 5,701,234 A | * | 12/1997 | Wong ........................... 257/786 |
| 4,737,845 A | | 4/1998 | Susuki et al. |
| 5,953,447 A | * | 9/1999 | Jin ............................... 382/151 |

FOREIGN PATENT DOCUMENTS

| | | |
|---|---|---|
| EP | 11214811 | 8/1999 |
| EP | 0341629 | 11/1999 |
| GB | 2249672 | 5/1992 |
| JP | 06302925 | 2/1988 |
| JP | 05-037197 | 2/1993 |
| JP | 07-240431 | 9/1995 |
| JP | 11135898 | 5/1999 |
| JP | 2000031611 | 1/2000 |
| WO | WO 9957954 | 11/1999 |

OTHER PUBLICATIONS

European Search Report, issued Apr. 4, 2002, corresponding to EPA No. 01310240.5.

* cited by examiner

Primary Examiner—Albert W. Paladini
(74) Attorney, Agent, or Firm—Brinks Hofer Gilson & Lione

(57) ABSTRACT

According to a structure for inspecting the alignment of a mounted electrical component of the present invention, a wiring pattern has fiducial portions extending closely along at least two outer edges of a rectangular electrical component. Accordingly, conventional silk-screen printed markers can be eliminated, resulting in a more productive and less expensive structure for inspecting the alignment of a mounted electrical component.

7 Claims, 3 Drawing Sheets

STRUCTURE FOR INSPECTING ELECTRICAL COMPONENT ALIGNMENT

BACKGROUND OF THE INVENTION

1. Field of the Invention

The present invention relates to a structure for inspecting the alignment of a mounted electrical component (hereinafter, referred to as a structure for inspecting the electrical component alignment), which is suitable for use in printed circuit boards used in various electronic devices.

2. Description of the Related Art

Referring to FIGS. 5 and 6, a known structure for inspecting the electrical component alignment will now be described. A planar insulated substrate 31 constituting a printed circuit board has a wiring pattern 34 having a first wiring pattern 32 and a second wiring pattern 33 both formed thereon, and an insulating resist layer 35 formed thereon so as to cover the wiring pattern 34.

The first wiring pattern 32 has a plurality of connections 32a formed by partially removing the resist layer 35.

An electrical component 36 has a rectangular outer casing 36a and a plurality of electrodes (not shown) mounted on the bottom surface of the outer casing 36a.

Mounting of the electrical component 36 on the printed circuit board is performed by applying solder cream (not shown) on the connections 32a of the first wiring pattern 32, placing the electrodes on the solder cream, and heating the printing circuit board in a furnace so as to solder the electrodes to the connections 32a in that order.

Surface mounting of the electrical component 36 is achieved by performing reflow soldering as described above. Alternatively, the electrodes can be soldered to the connections 32a in a state such that a ball grid array having metal balls adheres to the electrodes in this soldering process.

The first wiring pattern 32 is formed for mounting and wiring the electrical component 36. The second wiring pattern 33 is additionally formed for a desired electrical circuit.

Fiducial marks 37 are formed on the resist layer 35 by silk-screen printing. More particularly, the fiducial marks 37 are formed as an L-shape at a pair of orthogonally opposing corners of the outer casing 36a of the electrical component 36 along the edges of the rectangular outer casing 36a.

The fiducial marks 37 are formed on the resist layer 35 before mounting the electrical component 36. After the electrical component 36 is mounted, visual inspection of the fiducial marks 37 is performed to determine whether or not the electrical component 36 is aligned properly relative to the fiducial marks 37.

Since the fiducial marks 37 are formed on the resist layer 35 by silk-screen printing, the known structure for inspecting the electrical component alignment requires an additional step of silk-screen printing, thereby resulting in lower productivity and higher production cost.

SUMMARY OF THE INVENTION

Accordingly, it is an object of the present invention to provide a more productive and less expensive structure for inspecting the electrical component alignment.

To this end, a structure for inspecting the alignment of a mounted electrical component is provided. The structure comprises a printed circuit board having a wiring pattern and a rectangular electrical component mounted on the printed circuit board. The wiring pattern has fiducial portions extending closely along at least two mutually orthogonal outer edges of the rectangular electrical component.

The electrical component is preferably formed as a chip type comprising a rectangular outer casing and a plurality of electrodes mounted on the bottom surface of the outer casing.

The wiring pattern may further have a first wiring pattern which forms the fiducial portions extending along at least two mutually orthogonal outer edges of the electrical component.

The fiducial portions may further extend along the three or four outer edges of the electrical component.

The wiring pattern may further have a first wiring pattern for mounting the electrical component and a second wiring pattern which forms the fiducial portions extending along at least two mutually orthogonal outer edges of the electrical component.

The fiducial portions may further extend along the three or four outer edges of the electrical component.

The wiring pattern may further have a first wiring pattern for mounting the electrical component and a second wiring pattern so that the first wiring pattern and the second wiring pattern form the fiducial portions extending along at least two mutually orthogonal outer edges of the electrical component.

The structure for inspecting the alignment of a mounted electrical component may further comprise an insulating resist layer, which covers the fiducial portions, on the printed circuit board, wherein the fiducial portions are visible through the resist layer.

DESCRIPTION OF THE PREFERRED EMBODIMENTS

Figure 1:
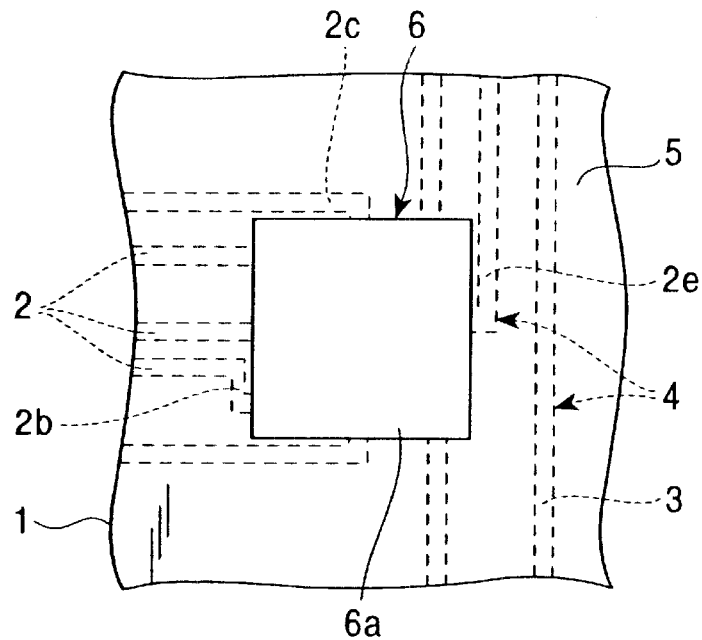
FIG. 1 is a plan view of a major part of a structure for inspecting the electrical component alignment according to a first embodiment of the present invention.
Figure 2:
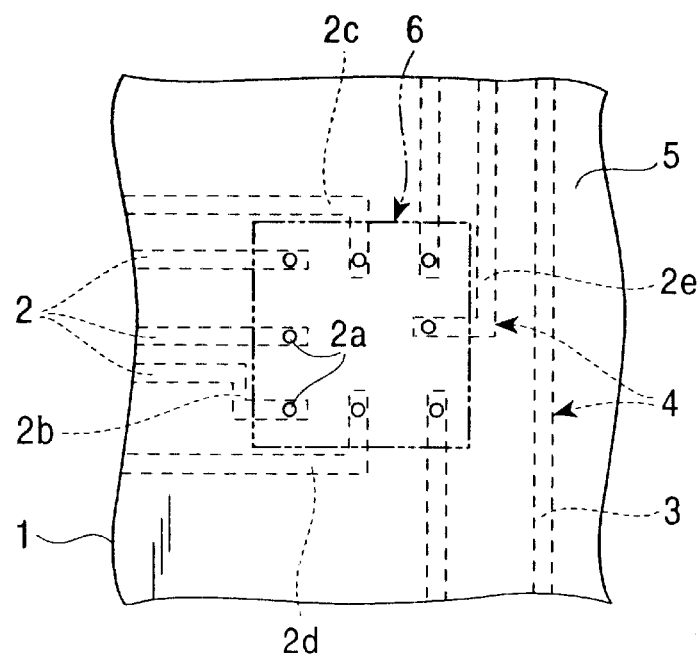
FIG. 2 is a plan view of the major part of the structure, shown without the electrical component, for inspecting the electrical component alignment according to the first embodiment of the present invention.
Figure 3:
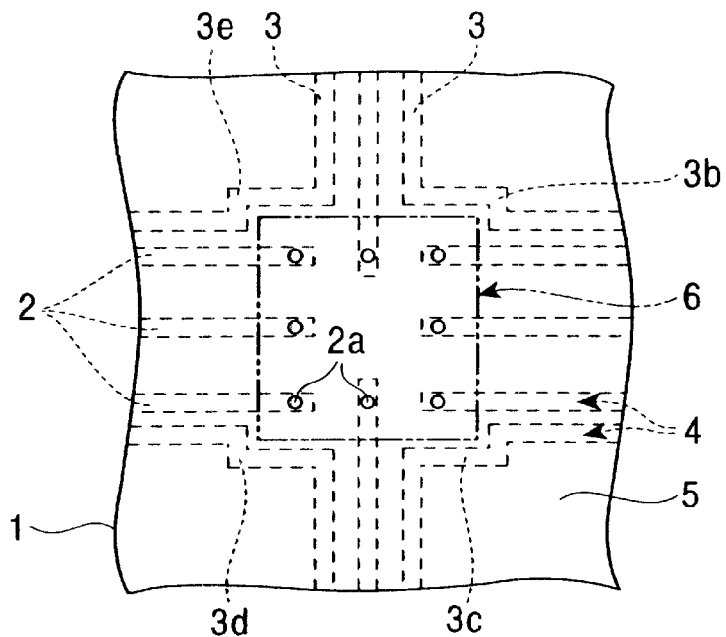
FIG. 3 is a plan view of a major part of a structure, shown without the electrical component, for inspecting the electrical component alignment according to a second embodiment of the present invention.
Figure 4:
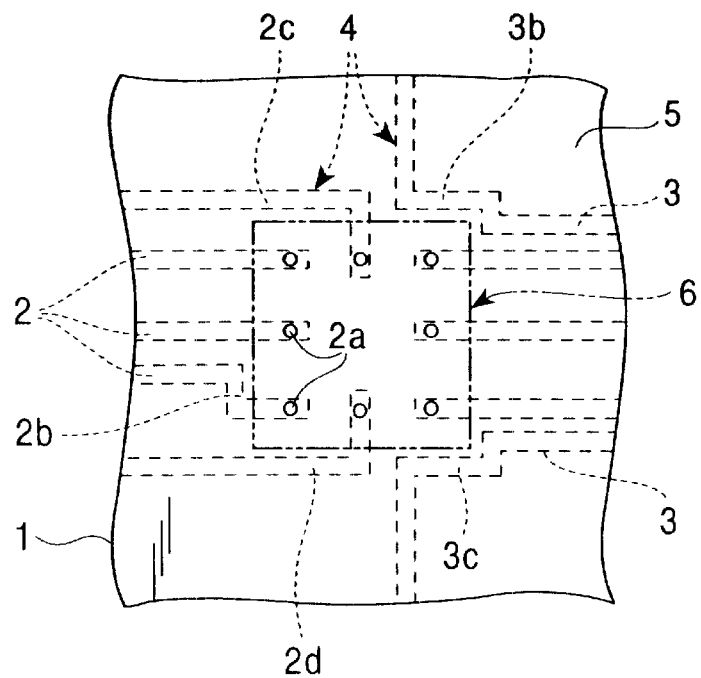
FIG. 4 is a plan view of a major part of a structure, shown without the electrical component, for inspecting the electrical component alignment according to a third embodiment of present invention.
Figure 5:
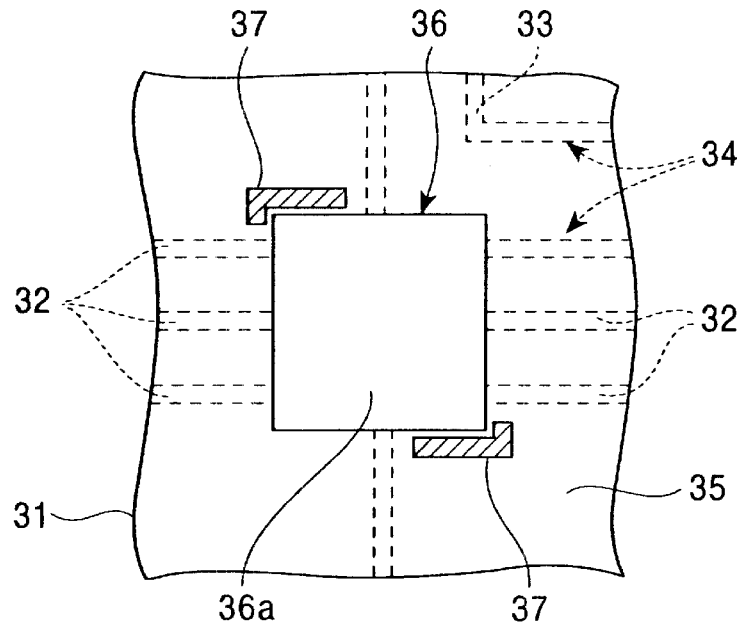
FIG. 5 is a plan view of a major part of a known structure for inspecting the electrical component alignment.
Figure 6:
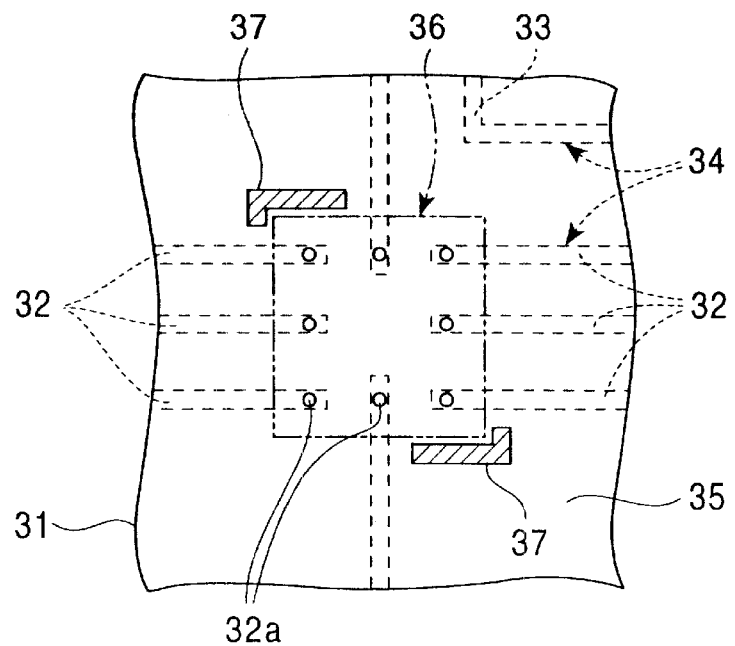
FIG. 6 is a plan view of the major part of the known structure, shown without the electrical component, for inspecting the electrical component alignment.

The accompanying drawings of a structure for inspecting the electrical component alignment will be described briefly. FIG. 1 is a plan view of a major part of a structure for inspecting the electrical component alignment according to a first embodiment of the present invention. FIG. 2 is a plan view of the major part of the structure, shown without an electrical component, for inspecting the electrical component alignment according to the first embodiment of the present invention. FIG. 3 is a plan view of a major part of a structure for inspecting the electrical component alignment according to a second embodiment of the present invention. FIG. 4 is a plan view of a major part of a structure, shown without the electrical component, for inspecting the electrical component alignment according to a third embodiment of the present invention.

Referring to FIGS. 1 and 2, a first structure for inspecting the electrical component alignment according to a first embodiment of the present invention will now be described. A planar insulated substrate 1 constituting a printed circuit board has a wiring pattern 4, having a first wiring pattern 2 and a second wiring pattern 3 both formed thereon, and an insulating resist layer 5 formed thereon so as to cover the wiring pattern 4.

The first wiring pattern 2 has a plurality of connections 2a formed by partially removing the resist layer 5.

A part of the first wiring pattern 2 extends closely along the outer edges of a rectangular electrical component 6, which will be referred to later, and has fiducial portions 2b, 2c, 2d, and 2e. These fiducial portions 2b, 2c, 2d, and 2e are formed along at least two mutually orthogonal edges of the electrical component 6.

The electrical component 6 has a rectangular outer casing 6a and a plurality of electrodes (not shown) mounted on the bottom surface of the outer casing 6a.

Mounting of the electrical component 6 on the resist layer 5 is performed by applying solder cream (not shown) on the connections 2a of the first wiring pattern 2, placing the electrodes on the solder cream, and heating the printed circuit board in a furnace so as to solder the electrodes to the connections 32a in that order.

Surface mounting of the electrical component 6 is achieved by performing reflow soldering as described above. Alternatively, the electrodes can be soldered to the connections 2a in a state such that a ball grid array having metal balls adheres to the electrodes in this soldering process.

The first wiring pattern 2 is formed for mounting and wiring the electrical component 6. The second wiring pattern 3 is additionally formed for a desired electrical circuit.

When the electrical component 6 is bonded to the wiring pattern 4, the fiducial portions 2b, 2c, 2d, and 2e lie closely along the edges of the rectangular outer casing 6a.

The resist layer 5 is formed of translucent material to allow for visual inspection of the wiring pattern 4 from outside. After the electrical component 6 is mounted, visual inspection of the electrical component 6 is performed to determine whether or not the electrical component 6 is aligned properly relative to the fiducial portions 2b, 2c, 2d, and 2e.

With reference to FIG. 3, a second structure for inspecting the electrical component alignment according to a second embodiment of the present invention will now be described. Though the first wiring pattern 2 has the fiducial portions 2b, 2c, 2d, and 2e in the first embodiment, a second wiring pattern 3 has fiducial portions 3b, 3c, 3d, and 3e in the second embodiment.

Since the other configuration of the second structure for inspecting the electrical component alignment according to the second embodiment is similar to the first one according to the first embodiment, like parts are denoted like reference numerals, and repetitive descriptions will be omitted.

Similarly to the first embodiment, the fiducial portions 3b, 3c, 3d, and 3e extend closely along the outer edges of the rectangular outer casing 6a of the electrical component 6. In addition, the fiducial portions 3b, 3c, 3d, and 3e extend along the corresponding corners of the rectangular outer casing 6a. Thus, after the electrical component 6 is mounted, visual inspection of the electrical component 6 is performed to determine whether or not the electrical component 6 is aligned properly relative to the fiducial portions 3b, 3c, 3d, and 3e.

These fiducial portions 3b, 3c, 3d, and 3e are formed along at least two mutually orthogonal edges of the electrical component 6.

With reference to FIG. 4, a third structure for inspecting the electrical component alignment according to a third embodiment of the present invention will now be described. In the third embodiment, the first wiring pattern 2 has the fiducial portions 2b, 2c, and 2d, and the second wiring pattern 3 has the fiducial portions 3b and 3c.

Since the other configuration of the third structure for inspecting the electrical component alignment according to the third embodiment is similar to the second one according to the second embodiment, like parts are denoted like reference numerals, and repetitive descriptions will be omitted.

The fiducial portions 2b, 2c, 2d, 3b, and 3c extend closely along the four outer edges of the rectangular outer casing 6a. Thus, after the electrical component 6 is mounted, visual inspection of the electrical component 6 is performed to determine whether or not the electrical component 6 is aligned properly relative to the fiducial portions 2b, 2c, 2d, 3b, and 3c.

These fiducial portions of the first wiring pattern 2 and the second wiring pattern 3 are formed along at least two mutually orthogonal edges of the electrical component 6.

In the structure for inspecting the electrical component alignment of the present invention, a part of the wiring pattern 4 extends closely along the outer edges of the rectangular electrical component 6, and has fiducial portions formed along at least two mutually orthogonal edges of the electrical component 6. This configuration can eliminate conventional silk-screen printed markers, leading to a more productive and less expensive structure for inspecting the electrical component alignment.

Further, since the electrical component 6 is formed as a chip type comprising a rectangular outer casing 6a and a plurality of electrodes mounted on the bottom surface of the outer casing 6a, the electrical component 6 has no mounting leg. Accordingly, it becomes easier to form fiducial portions along the outer edges of the electrical component 6, and thus the structure for inspecting the electrical component alignment is preferably used for an electrical component having no mounting leg.

Further, the wiring pattern 4 has the first wiring pattern 2 for mounting the electrical component 6, and the first wiring pattern 2 has fiducial portions 2b and 2c. Since these fiducial portions 2b and 2c are formed along at least two mutually orthogonal edges of the electrical component 6, the first wiring pattern 2 for mounting the electrical component 6 is usable for alignment inspection, thereby leading to a smaller, more productive, and less expensive structure for inspecting the electrical component alignment.

Further, since the fiducial portions 2b, 2c, and 2d are formed along the three or four outer edges of the electrical component 6, more reference points are provided for alignment inspection, thereby resulting in reliable and easy visual alignment inspection.

Further, the wiring pattern 4 has the second wiring pattern 3 in addition to the first wiring pattern 2 for mounting the electrical component 6. Since the second wiring pattern 3 has fiducial portions 3b and 3c extending along at least two mutually orthogonal edges of the outer electrical component 6, the conventional silk-screen printed makers can be eliminated, thereby leading to a more productive and less expensive structure for inspecting the electrical component alignment.

Further, since the fiducial portions 3b, 3c, and 3d are formed along the three or four outer edges of the electrical component 6, more reference points are provided for alignment inspection, thereby resulting in reliable and easy visual alignment inspection.

Further, the wiring pattern 4 has the second wiring pattern 3 in addition to the first wiring pattern 2 for mounting the electrical component 6. Since the first wiring pattern 2 and the second wiring pattern 3 have fiducial portions extending along at least two mutually orthogonal edges of the outer electrical component 6, the conventional silk-screen printed makers can be eliminated, thereby leading to a more productive and less expensive structure for inspecting the electrical component alignment.

Further, the printed circuit board has the insulating resist layer 5 covering the wiring pattern 4 so that the fiducial portions are visible through the resist layer 5. With this configuration, alignment inspection of the printed circuit board is performed without damaging the wiring pattern 4.

What is claimed is:

1. A structure for inspecting the alignment of a mounted electrical component, comprising:

a printed circuit board having a wiring pattern; and a rectangular electrical component mounted on the printed circuit board, wherein the wiring pattern comprises a first wiring pattern to which the electrical component is electrically connected, the first wiring pattern having fiducial portions extending closely along at least two mutually orthogonal outer edges of the rectangular electrical component, the fiducial portions providing a reference for inspecting the alignment of the electrical component with the printed circuit board.

2. The structure for inspecting the alignment of a mounted electrical component according to claim 1, wherein the electrical component is formed as a chip type comprising a rectangular outer casing and a plurality of electrodes mounted on the bottom surface of the outer casing.

3. The structure for inspecting the alignment of a mounted electrical component according to claim 1, wherein the fiducial portions extend along at least three outer edges of the electrical component.

4. The structure for inspecting the alignment of a mounted electrical component according to claim 1, wherein the wiring pattern further comprises a second wiring pattern that is not electrically connected to the electrical component, the second wiring pattern having fiducial portions extending along one or more outer edges of the electrical component.

5. The structure for inspecting the alignment of a mounted electrical component according to claim 4, wherein the fiducial portions of the first wiring pattern and the fiducial portions of the second wiring pattern extend along at least three outer edges of the electrical component.

6. The structure for inspecting the alignment of a mounted electrical component according to claim 1, further comprising an insulating resist layer that covers the fiducial portions on the printed circuit board, wherein the fiducial portions are visible through the resist layer.

7. The structure for inspecting the alignment of a mounted electrical component according to claim 6, wherein the insulating resist layer comprises a transparent or translucent material.

* * * * *